United States Patent
Farroni et al.

(10) Patent No.: US 6,230,956 B1
(45) Date of Patent: May 15, 2001

(54) SOLDERING CONVEYOR SUPPORT

(75) Inventors: Jean-Paul Farroni, Saint Avertin; Christian Gehin, La Membrolle sur Choisille, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/363,612

(22) Filed: Jul. 29, 1999

(30) Foreign Application Priority Data

Jul. 31, 1998 (FR) .................................................. 98 10081

(51) Int. Cl.[7] ............................... B23K 1/008; F27B 9/08
(52) U.S. Cl. ......................... 228/47.1; 228/49.5; 219/388; 432/153
(58) Field of Search ................................. 228/47.1, 49.5, 228/228, 212, 178, 179.1; 219/433, 444.1, 399, 388; 392/416, 418; 432/121, 153

(56) References Cited

U.S. PATENT DOCUMENTS

| | | |
|---|---|---|
| 3,282,447 | * 11/1966 | McMaster . |
| 3,771,948 | * 11/1973 | Matsumiya . |
| 3,797,103 | 3/1974 | Desmond et al. .................. 29/583 |
| 4,142,304 | * 3/1979 | Ricci et al. . |
| 4,795,518 | * 1/1989 | Meinel et al. .................. 156/285 |
| 5,854,468 | * 12/1998 | Muka .............................. 219/443 |

OTHER PUBLICATIONS

French Search Report from French Patent Application 98 10081, filed Jul. 31, 1998.

Patent Abstracts of Japan, vol. 014, No. 396 (E–0970), Aug. 27, 1990 & JP–A–02 150051 (Oki Electric Ind. Co. Ltd.).

* cited by examiner

Primary Examiner—Clifford C. Shaw
Assistant Examiner—Jonathan Johnson
(74) Attorney, Agent, or Firm—Wolf, Greenfield & Sacks, P.C.; James H. Morris; Theodore E. Galanthay

(57) ABSTRACT

A conveyor support for integrated circuits in an on-line oven, including a mechanism for driving and guiding the elements to be soldered while maintaining a lower surface of one of said elements in direct contact with a wall of the oven.

12 Claims, 3 Drawing Sheets

SOLDERING CONVEYOR SUPPORT

BACKGROUND OF THE INVENTION

1. Field of the Invention

The present invention relates to the field of integrated circuit assembly. More specifically, the present invention relates to a support for conveying integrated circuit elements in a soldering oven.

2. Discussion of the Related Art

After manufacturing a semiconductive integrated circuit chip, said chip must be attached on other elements before encapsulation of the assembly in a package. These elements are often attached together before assembly of the chip. Among these elements, some appear in the form of strips such as a connection frame or a heat sink, while other elements appear in the form of individualized elements such as insulating pads, for example, made of ceramic.

To attach together these different elements by batches, a soldering method is conventionally used. Such a method consists of fusing an intermediary fusible element (or solder paste) placard between two elements to be assembled. To reach the temperatures required for this fusion, each batch of elements to be soldered is placed on a support, which is exposed to a heat source in an oven.

An embodiment of a conventional soldering method is illustrated in FIG. 1.

FIG. 1 shows a transversal cross-section of an oven associated with an example of conventional conveyor support 5 and on a wall 1 of which support 5 is moved. Such an oven generally is called an on-line oven. A connection frame 2 is desired to be soldered on an isolating element 3, for example, a ceramic pad, and this same element 3 is desired to be simultaneously soldered on a heat sink 4. The assembly of these three elements rests upon support 5. A driving system (not shown) enables moving support 5 along wall 1 of the oven, for example, in the direction indicated by arrow A in FIG. 1.

To ensure a stable hold and an accurate positioning of the different elements before assembly, support 5 includes a base 5-1, typically made of aluminum. Base 5-1 has a stepped shape adapted to receiving in a low portion 5-11 heat sink strip 4 and individualized pads 3. A high portion 5-12 of the step is adapted to receiving a first strip-shaped portion 2-1 of frame 2, the lower surface of a second portion 2-2 of frame 2, forming one piece with its first portion 2-1, contacting the upper surface of each of pads 3. Between each of these elements, a determined amount of solder paste (not shown) adapted to the surfaces to be assembled, as well as to the desired thickness for the soldering between these elements, is deposited. High portion 5-12 of the support also includes a protruding portion 5-13 (formed of punctual elements or continuous), the object of which will be described hereafter.

A weight 5-2 is placed above the assembly thus obtained. Weight 5-2 has the object of holding the hold of elements 2, 3, and 4 to be soldered during the flat motion of the conveyor support, and of applying a homogeneous mechanical pressure on the surface of frame 2 to help the forming of soldered joints between frame 2 and each of pads 3 and between the pads and heat sink 4. Weight 5-2 is stabilized in a raised position with respect to surface 2-1 of frame 2, in a way which will be described hereafter, to apply an identical and homogeneous pressure on surface 2-1 of frame 2 in different punctual locations. For this purpose, weight 5-2 essentially includes a body 5-21 in which are attached two series of risers 5-22 and 5-23.

A first series of risers 5-22 counterbalances and stabilizes weight 5-2 in cooperation with protruding portion 5-13 of base 5-1 and with a bearing means (not shown) adapted to receive weight 5-2, for example, by engaging of tabs provided on each side of the lower surface of body 5-21 into reception openings (not shown) made in the vicinity of the lateral ends of base 5-1. Riser assembly 5-22 associated with the bearing means enables placing weight 5-2 in a stable and raised position with respect to frame 2. In other words, body 5-21 of weight 5-2 never is in contact with the surface of frame 2.

Weight 5-2 also includes a second series of risers 5-23 with a vertical clearance in body 5-21, each being associated with an axial stem 5-24. Stems 5-24, forming one piece with risers 5-23, can thus move along the vertical direction of FIG. 1 within the limits of the clearance of risers 5-23 in body 5-21. The lower ends of stems 5-24 bear on first portion 2-1 of connection frame 2. This contact is performed as close as possible to the step of base 5-1 as allowed by the mechanical tolerances of each of the components of support 5 (and especially the bearing means, not shown). Further, these contact points are, preferably, located at equal distance from two locations to be soldered. Thus, considering a batch in which twenty soldering operations have to be performed, that is, including a piling formed of sink strip 4, of twenty individual pads 3, and of portion 2-2 of frame 2, body 5-21 includes nineteen risers 5-23.

It should be noted that the location of the bearing means is, seen from the side, at an intermediary position between risers 5-22 and 5-23, preferably, as close as possible to risers 5-23. Of course, to ensure the stabilization counterbalancing function of weight 5-2, the weight of risers 5-22 is adapted to the distance separating the bearing means from stems 5-24 of risers 5-23.

A disadvantage of the conventional method described hereabove is the significant loss of thermal power. Indeed, the heat emitted by wall 1 of the on-line oven must propagate through base 5-1 of support 5 to reach the locations where the soldered joints have to be formed.

To minimize such losses, supports made of a material having an excellent heat conductivity, that is, aluminum, are conventionally used. However, a large thickness has to be provided for reasons of mechanical stability. Indeed, under a given minimum thickness, an aluminum support tends to deform under the effect of heat. This deformation affects the alignment of the elements to be soldered which must be accurate to one tenth of a millimeter. As a result, the benefit in terms of heat is then nullified by the thickness increase necessary to the mechanical hold.

SUMMARY OF THE INVENTION

An object of the present invention is to provide a novel equipment for soldering integrated circuit elements which overcomes these disadvantages.

More specifically, the present invention aims at providing a novel integrated circuit conveyor support which is dissipates less heat.

The present invention also aims at providing such a support which enables an accurate positioning of the elements with respect to one another and a maintaining of this positioning during the motion.

To achieve these objects as well as others, the present invention provides a conveyor support for integrated circuit elements in an on-line oven, including means for driving and guiding the elements to be soldered while maintaining a lower surface of at least one of said elements in direct contact with a wall of the oven.

According to an embodiment of the present invention, the support is made of stainless steel.

According to an embodiment of the present invention, the means include a solid portion and at least one narrow tab laterally and vertically protruding.

The present invention also provides an on-line oven adapted to receive a support of the above-mentioned type, and including grooves adapted to cooperate with the tabs so that the upper portion of the tabs is coplanar with the upper portion of the oven wall and with the lower surface of one of said elements.

The foregoing objects, features and advantages of the present invention will be discussed in detail in the following non-limiting description of specific embodiments in connection with the accompanying drawings.

DETAILED DESCRIPTION

For clarity, the same elements have been designated with the same references in the different drawings. Further, the different elements are not drawn to scale for a better understanding.

Figure 2:
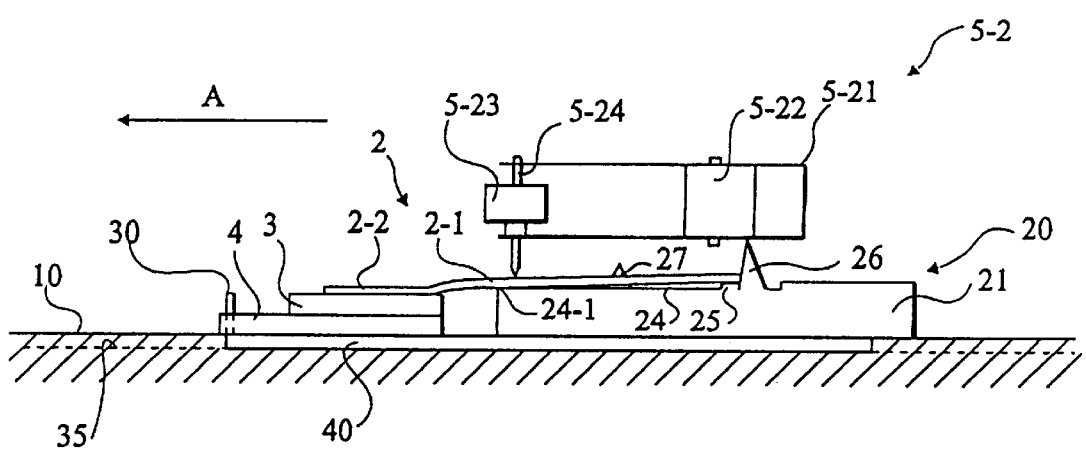
FIG. 2 shows, in profile and in transversal cross-section, a support according to the present invention, supporting elements to be soldered and placed in a soldering oven.

FIG. 2 schematically shows, in a partial side transversal cross-section view, a conveyor support 20 according to the present invention. Support 20 will be described generally herein. The detailed structure of support 20 will be described more completely in relation with FIG. 4.

Figure 1:
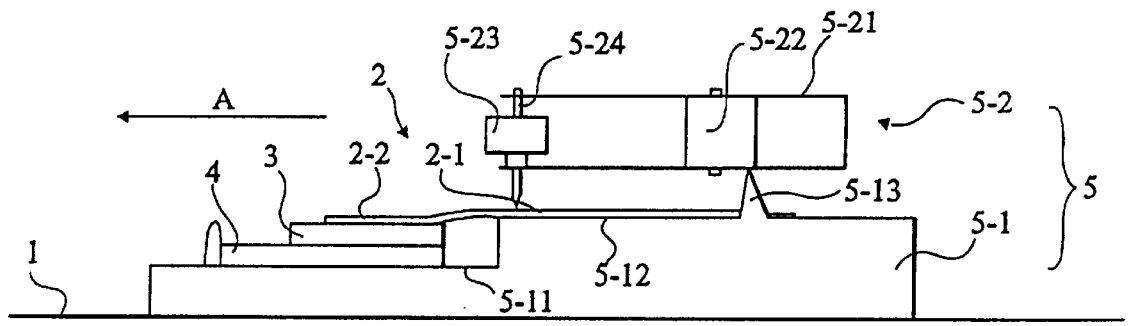
FIG. 1, previously described, is meant to show the state of the art and the problems to solve.

Support 20 supports elements to be soldered, for example, identical to those of FIG. 1: a heat sink strip 4, isolating pads 3, for example, made of ceramic, and a connection frame 2, formed, as previously, of a high portion 2-1 and of a low portion 2-2. As in a conventional method, it is desired to solder portion 2-2 of frame 2 with each of individual pads 3, and to solder the same pads 3 with sink 4.

A feature of the present invention is that support 20 is formed so that the upper surface of the lower element to be soldered, here, sink 4, is in direct contact with a wall 10 of an on-line oven.

For this purpose, and as will be described in further detail in relation with FIGS. 3 and 4, support 20 includes a solid portion 21 and at least one narrow tab 40 forming a punctual support means. Preferably, several tabs 40 are regularly distributed along support 20. Tab(s) 40 form one piece with portion 21.

Elements 2, 3, and 4 to be soldered are driven and guided by support 20 as follows.

Heat sink strip 4 rests on tabs 40, which include means, especially tappets 30, adapted to accurately position it. It should be noted that tabs 40 must be as few as possible, for example, three, and as narrow as possible, to maximize the surface of sink 4 in direct contact with wall 10 of the oven.

Solid portion 21 includes, preferably, a hollowed portion 24 which includes at least one centering slug 27 in its portion proximal to tabs 40. Hollowed portion 24 also includes pads 25 and slugs 26 in the portion distal from tabs 40.

Portion 2-1 of frame 2 is supported by portion 21 of support 20, in the hollowed portion 24 thereof, by the bearing points formed by pads 25. Portion 2-1 is, for example, maintained in position by its rear abutment with slugs 26 and the engagement of slug 27 into openings provided for this purpose, as will be described in further detail in relation with FIG. 3.

As previously, to guarantee the hold of elements 2, 3, and 4 to be soldered during the motion of support 20 along wall 10 of the oven, for example, in the direction indicated by arrow A and by conventional means, support 20 is adapted to cooperate with a conventional weight system, for example, identical to weight 5-2 shown in FIG. 1.

It should be noted that, as previously, risers 5-23 exert with their respective axial stems 5-24, a punctual pressure at the surface of portion 2-1 of gate 2.

Weight 5-2, as in the conventional method described in relation with FIG. 1, is maintained in a stable raised position with respect to surface 2-1. This is made possible by having weight 5-2 rest, on the one hand, on slugs 26 of support 20 according to the present invention, and on the other hand, on a bearing means, which will be described in further detail in relation with FIG. 4.

A feature of the present invention is that wall 10 of the oven includes grooves 35 adapted to receive tabs 40 of support 20 according to the present invention. It should thus be noted that tabs 40 protrude from the lower surface of base 21.

Figure 3:
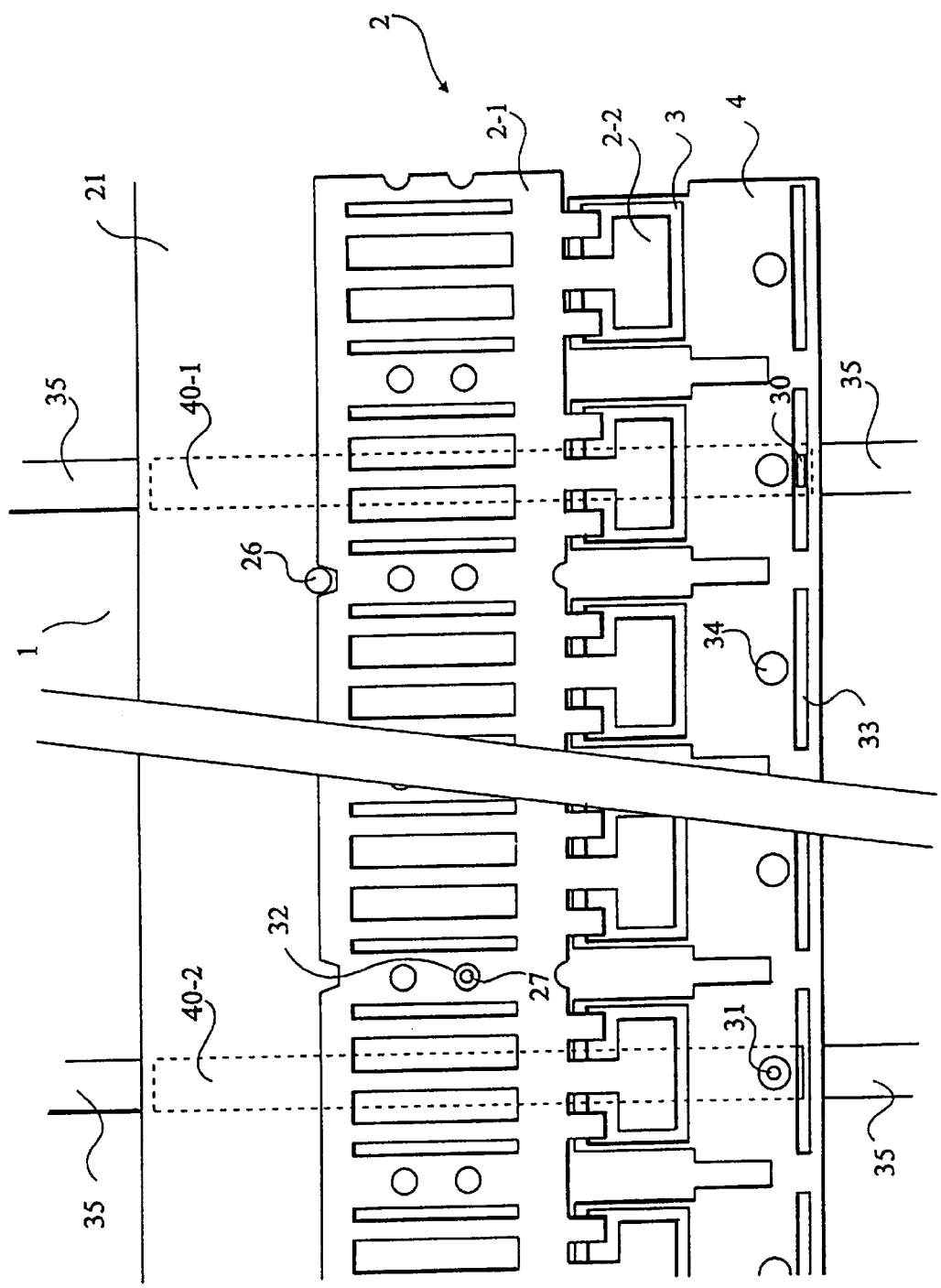
FIG. 3 shows a partial top view of the assembly of FIG. 2.

FIG. 3 shows a simplified partial top view of the assembly shown in FIG. 2, formed by elements to be soldered supported by a support 20 of the present invention. The elements to be soldered are a heat sink 4 formed of a metal strip, individualized insulator pads 3, for example, made of ceramic, and a connection frame 2. To form such an assembly, sink strip 4 is placed on lateral and central tabs 40-1 and 40-2 (in dotted lines in the drawing), so that tappets 30 protruding from the free ends of lateral tabs 40-1 cooperate with first openings 33 of the sink and so that a point 31 protruding from the free end of tab 40-2 cooperates with an opening of a second type 34.

According to the preferred embodiment shown, two lateral tabs 40-1 and one central tab 40-2 are provided to drive and position the strip forming sink 4. It should be noted that tappets 30 and slug 31 are, preferably, arranged to ensure three positioning points for metal strip 4, central slug 31 ensuring the X positioning and tappet 30 ensuring the Y positioning.

A layer of solder paste (not shown) is then deposited at the required locations. Pads 3 are placed above these locations. A new layer of solder paste is deposited, at least on a portion of the surface of pads 3, after which connection frame 2 is brought.

Connection frame 2 is deposited so that its first portion 2-1 cooperates with bearing pads 25 (FIG. 2) and slugs 26 and 27 of hollowed portion 24 of solid portion 21 of support 20, so that the alignment and vertical position of portions 2-2 of the connection frame to be soldered are perfectly defined. More specifically, portion 2-1 of frame 2 abuts by its rear periphery against slugs 26 and includes an opening 32 adapted to receive slug 27 of hollowed portion 24 of solid portion 21 on which is placed portion 2-1 of the frame.

Figure 4:
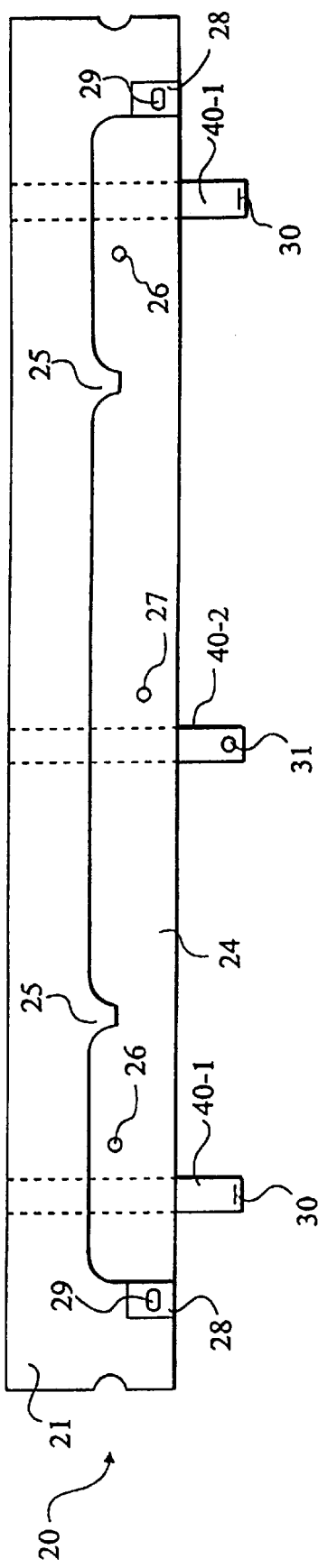
FIG. 4 shows, in top view, an embodiment of a support according to the present invention without elements to be soldered.

FIG. 4 shows an example of a conveyor support 20 according to the present invention. Bearing pads 25, formed in hollowed portion 24 of solid portion 21, preferably are of very small dimensions. It is preferred to use as a bearing for an integrated circuit element to be soldered (sink 4, FIGS. 2 and 3) such pads 25 rather than a continuous surface, to reduce the contact with the conveyor support which must remain cold. In practice, to minimize possible misalignments by ensuring a sufficient bearing surface for the element to be supported (frame 2, FIGS. 2 and 3), two pads are enough.

It should be noted that the upper surface of bearing pads 25 is at a higher elevation than that of portion 24, as more clearly appears in FIG. 2.

In portion 24, slugs 26 are for example placed so that their periphery is tangent to the alignment of the ends of pads 25 and so that slugs 26 are entirely in recess from these ends with respect to the free edge of portion 24. Thus, when the rear edge of an element to be soldered, here, the edge of portion 2-1 of frame 21 (FIGS. 2 and 3), abuts against slugs 26, this element is supported by pads 25. Further, slugs 26 ensure, as has been described in relation with FIG. 2, a bearing point intended for stabilizing weight 5-2 during the motion of support 20. Their height is thus chosen accordingly.

Slug 27 is substantially in the middle of the length of hollowed portion 24. Its precise position with respect to pads 25 and to slugs 26 is chosen to ensure a third positioning point of an element to be soldered (frame 2, FIGS. 2 and 3) by engaging into an opening (32, FIG. 3).

Support 20 also includes, on its solid portion 21, on either side of hollowed portion 24, raised elements 28 at the center of which have been formed openings 29 intended for receiving a conventional weight system and for being used as a bearing point thereby.

Preferably, tabs 40 of the support extend across the entire width of portion 21, to ensures a stability of the entire support, especially upon placing the elements to be soldered, which is not necessarily done in rails.

Preferably, height adjustment pads (not shown) intended for reducing the contact of the conveyor support with the wall oven, are provided between the lower surface of solid portion 21 and each of tabs 40-1, 40-2, since the conveyor support has to remain as cold as possible, to avoid extracting too many calories.

An advantage of the present invention is to enable direct contact of the lower surface of an element to be soldered with the oven wall.

Another advantage of the present invention is that since support 20 no longer has to transmit heat to the soldering area, it may be made of a material, for example, stainless steel, having a lower heat conductivity, but better mechanical characteristics than aluminum. The support according to the present invention can thus be thinner and, above all, the dimensions of tabs 40 can be reduced to maximize the surface in direct contact with the oven wall.

Of course, the present invention is likely to have various alterations, modifications, and improvements which will readily occur to those skilled in the art. Especially, although the present invention has been described with specific sizings (nature and number of slugs, tabs, bearing means, weight . . . ), any sizing may be used, provided that the obtained support for conveying an integrated circuit element includes punctual support elements distributed above the soldering area to maximize the lower surface of the lower element (in the example shown, heat sink strip 4) in contact with a wall of an on-line oven.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An on-line oven, in combination with a conveyor support for integrated circuit elements including means for driving and guiding the elements to be soldered while maintaining a lower surface of one of said elements in direct contact with a wall of the oven, said means including a solid portion and at least one tab and further including at least one groove adapted to cooperate with the tab so that an upper portion of the tab is coplanar with an upper portion of the oven wall and with a lower surface of one of said elements.

2. In combination, a conveyor support for integrated circuit elements, and an on-line oven, and in which the conveyor support has a driving system to enable the conveyor support to move along a wall of the on-line oven from which it is supported, the improvement comprising:

separate parts of said conveyor support and said oven wall adapted to intercooperate so that a lower surface of one of said elements is in direct contact with said oven wall;

whereby said lower surface of said one of said elements is maintained in said direct contact as said conveyor support is driven along said wall.

3. The combination of claim 2, wherein said separate parts comprise separate interlocking parts.

4. The combination of claim 3, wherein said separate interlocking parts include a tab part and a groove part.

5. The combination of claim 4, wherein the groove cooperates with the tab so that an upper portion of the tab is coplanar with an upper portion of the oven wall and with a lower surface of one of said elements.

6. The combination of claim 3, wherein said separate interlocking parts include at least one groove in said oven wall and at least one tab supported by said conveyor support for interlocking with said groove.

7. The combination of claim 6, wherein said wall has a plurality of grooves and said conveyor support has a like plurality of tabs.

8. The combination of claim 7, wherein said elements include a heat sink in direct contact with the wall of the oven.

9. The combination of claim 8, wherein said conveyor support includes a solid portion having a hollowed portion which includes at least one centering slug.

10. The combination of claim 9, wherein said centering slug is disposed proximal to said tabs.

11. The combination of claim 10, wherein said hollowed portion also includes pads and slugs in the portion distal from the tabs.

12. An apparatus for conveying integrated circuit elements in an on-line oven, including means for driving and guiding the elements to be soldered while maintaining a lower surface of one of said elements in direct contact with a wall of the oven, said means for driving and guiding including a solid portion having a plurality of tabs, and including grooves adapted to cooperate with the tabs so that an upper portion of the tabs is coplanar with an upper portion of the oven wall and with a lower surface of one of said elements.

* * * * *